United States Patent
Aleman et al.

(10) Patent No.: US 8,456,243 B2
(45) Date of Patent: Jun. 4, 2013

(54) FAILSAFE OSCILLATOR MONITOR AND ALARM

(75) Inventors: Enrique Aleman, Gilbert, AZ (US);
Jonathan Dillon, Tempe, AZ (US);
Vivien Delport, Chandler, AZ (US);
Joseph Julicher, Maricopa, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 698 days.

(21) Appl. No.: 12/732,595

(22) Filed: Mar. 26, 2010

(65) Prior Publication Data

US 2011/0234417 A1 Sep. 29, 2011

(51) Int. Cl.
*H03L 7/23* (2006.01)
(52) U.S. Cl.
USPC ............ 331/2; 713/500; 331/46; 331/16; 331/34; 331/175
(58) Field of Classification Search
USPC .............. 331/2, 46, 47, 16, 34, 175
See application file for complete search history.

(56) References Cited

U.S. PATENT DOCUMENTS

| 6,219,797 | B1 * | 4/2001 | Liu et al. ............ | 713/500 |
| 6,668,334 | B1 | 12/2003 | Abel et al. ............ | 713/500 |
| 7,493,505 | B2 * | 2/2009 | Leung .............. | 713/323 |
| 7,844,837 | B2 * | 11/2010 | Youssef ............ | 713/194 |

FOREIGN PATENT DOCUMENTS

| JP | 10062456 A | 3/1998 |
| JP | 2003172762 A | 6/2003 |

OTHER PUBLICATIONS

International PCT Search Report, PCT/US2011/029719, 2 pages.

* cited by examiner

*Primary Examiner* — Arnold Kinkead
(74) *Attorney, Agent, or Firm* — King & Spalding L.L.P.

(57) ABSTRACT

A failsafe oscillator monitor and alarm circuit receives clock pulses from an external oscillator that if a failure thereto occurs, the failsafe oscillator monitor and alarm circuit will notify a digital processor of the external oscillator failure. The failsafe oscillator monitor and alarm circuit is a very low current usage circuit that charges a storage capacitor with clock pulses from the external oscillator when functioning normally and discharges the storage capacitor with a constant current sink if the external oscillator stops functioning. When the voltage charge on the storage capacitor becomes less than a reference voltage an alarm signal is sent to the digital processor for exception or error handling of the failed external oscillator.

19 Claims, 2 Drawing Sheets

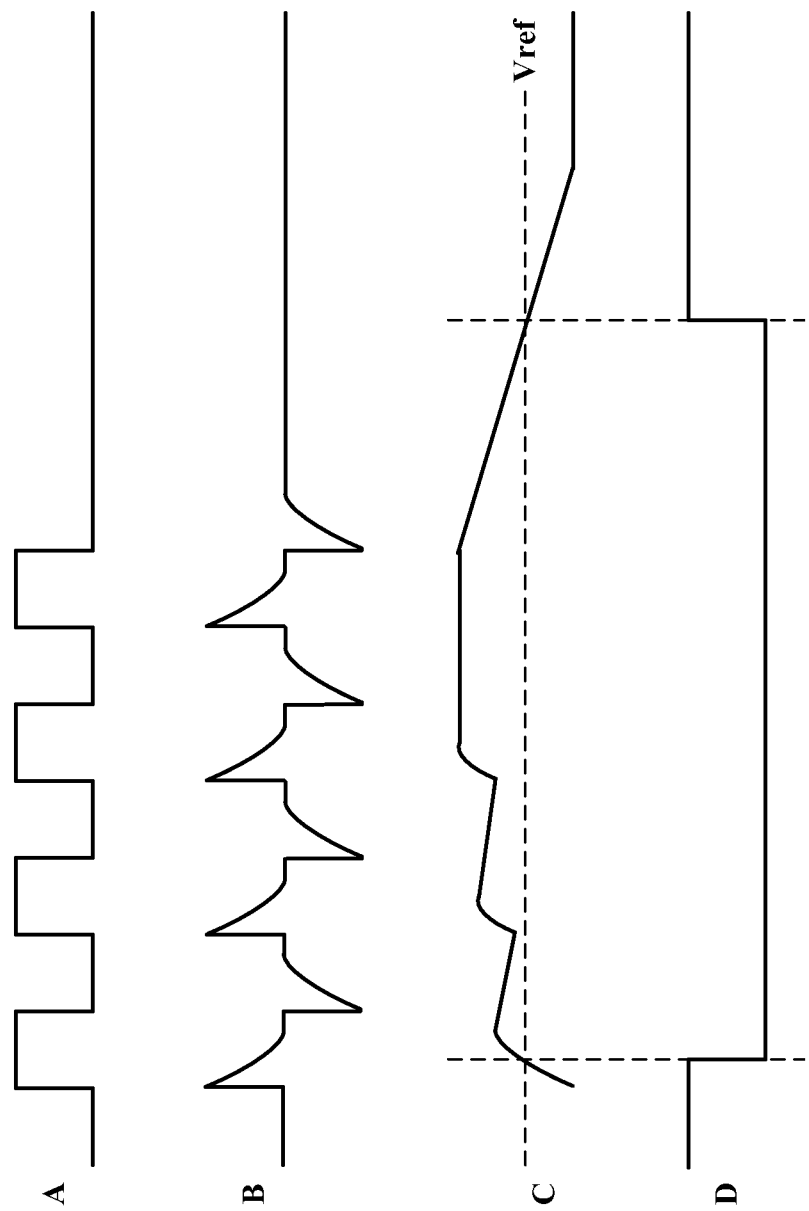

FAILSAFE OSCILLATOR MONITOR AND ALARM

TECHNICAL FIELD

The present disclosure relates to integrated circuit devices using an external clock oscillator, and more particularly, to monitoring of the external clock oscillator and alarming if operation thereof fails.

BACKGROUND

Electronic applications having a digital device with a processor often use an external frequency determining element(s) and/or external oscillator, e.g., crystal or ceramic resonator and/or electronic circuit, to establish a stable time base for determining periodic wake-up from a low power, e.g., standby or sleep, mode. Should this external frequency determining element(s)/oscillator stop for any reason, the processor of the digital device will remain asleep unless awoken to an operational mode by another trigger event. A possible work around to this problem is to enable a watchdog timer in the digital device and use it as a failsafe if failure of the external oscillator should occur. However, use of the watch-dog timer in the digital device may excessively raise sleep (standby) current consumption of the digital device and possibly other closely interrelated device applications. Therefore, to lower the power consumption of the digital device the watch-dog timer is typically disabled. Without a wakeup trigger signal from the watch-dog timer to the processor of the digital device, the processor will remain asleep if the external oscillator should fail when the processor is in the low power mode. Alternately (in an operational mode) the processor must remain awake long enough to verify that the external frequency determining element(s)/oscillator is operating. This additional time spent in the operational mode will increase power consumption of the digital device.

SUMMARY

The aforementioned problem is solved, and other and further benefits achieved by using a simple delay and monitoring circuit that is charged to a first logic level when an external frequency determining element(s)/oscillator is running, and discharges (times out) to a second logic level if the external frequency determining element(s)/oscillator fails.

According to a specific example embodiment of this disclosure, a digital device having a primary clock oscillator monitor and alarm comprises: a processor having an operational mode and a low power sleep mode; a timer counter having an output coupled to an input of the processor, and an input for accepting a plurality of clock pulses; a primary clock oscillator coupled to the input of the timer counter and an external frequency determining element, wherein the primary clock oscillator generates the plurality of clock pulses at a frequency determined by the external frequency determining element; a direct current (DC) blocking capacitor coupled to the primary clock oscillator; a diode connected to the DC blocking capacitor; a voltage storage capacitor connected to the diode, wherein the voltage storage capacitor is charged to a voltage through the diode and from the plurality of clock pulses; a current sink connected to the voltage storage capacitor, wherein the current sink discharges the voltage on the voltage storage capacitor when not being charged from the plurality of clock pulses; and a voltage comparator having an output connected to an input of the processor, a first input connected to the voltage storage capacitor and a second input connected to a reference voltage, wherein when the voltage on the voltage storage capacitor is greater than the reference voltage the output of the voltage comparator is at a first logic level, and when the voltage on the voltage storage capacitor is less than or equal to the reference voltage the output of the voltage comparator is at a second logic level.

According to another specific example embodiment of this disclosure, a method of monitoring a primary clock oscillator of a digital device and generating an alarm upon failure thereof comprises: charging a voltage storage capacitor to a voltage with a plurality of pulses from a primary clock oscillator; monitoring the voltage on the voltage storage capacitor with a voltage comparator, wherein when the voltage on the voltage storage capacitor is greater than a reference voltage no alarm is issued from the voltage comparator, and when the voltage on the voltage storage capacitor is less than or equal to the reference voltage the alarm is issued from the voltage comparator; and switching to a backup clock after the alarm is issued from the voltage comparator. Wherein a processor has an operational mode and a low power sleep mode, and the processor awakens from the low power sleep mode to the operational mode when the alarm is issued from the voltage comparator.

BRIEF DESCRIPTION OF THE DRAWINGS

A more complete understanding of the present disclosure thereof may be acquired by referring to the following description taken in conjunction with the accompanying drawings wherein:

FIG. 2 illustrates schematic voltage-time waveforms of various signal points in the schematic of the digital device shown in FIG. 1.

Figure 1:
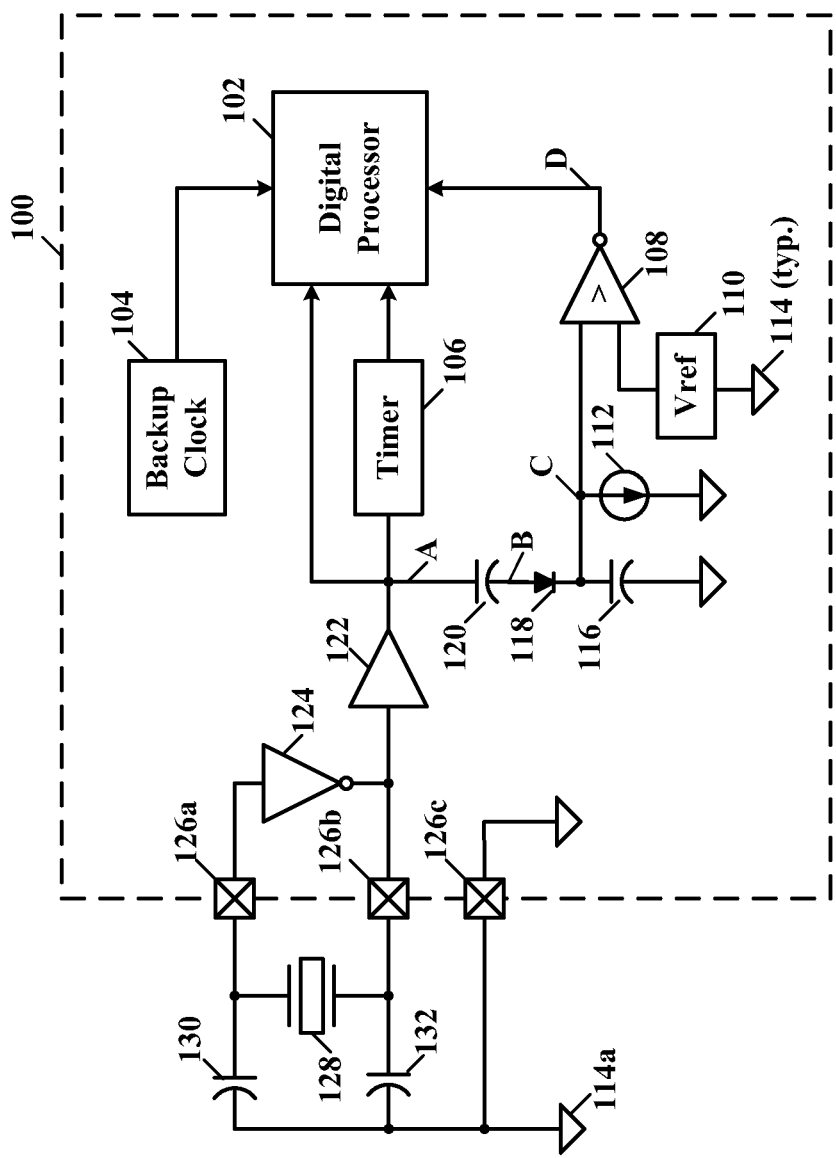
FIG. 1 illustrates a schematic diagram of a digital device having a circuit for monitoring operation of an external frequency determining element(s)/oscillator and signaling a processor of the digital device if the external frequency determining element(s)/oscillator fails, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of a specific example embodiment is schematically illustrated. Like elements in the drawings will be represented by like numbers, and similar elements will be represented by like numbers with a different lower case letter suffix.

Referring to FIG. 1, depicted is a schematic diagram of a digital device having a circuit for monitoring operation of an external frequency determining element(s)/oscillator and signaling a processor of the digital device if the external frequency determining element(s)/oscillator fails, according to a specific example embodiment of this disclosure. A digital device 100 comprises a processor 102, a backup clock 104, a timer counter 106, a voltage comparator 108, a voltage reference 110, a current sink 112, a voltage storage capacitor 116, a diode 118, a direct current (DC) blocking capacitor 120, a buffer 122 and an oscillator inverter 124. The oscillator inverter 124 is coupled to an external frequency determining element 128, e.g., a crystal, ceramic resonator, etc., and load capacitors 130 and 132. One or both of the load capacitors 130 and 132 may be used as feedback and/or frequency adjustment components for a primary clock oscillator formed by the oscillator inverter 124 and frequency determining element 128. It is contemplated and within the scope of this disclosure that the diode 118 and/or voltage storage capacitor 116 and blocking capacitor 120 may be internal or external to the digital device 100, e.g., not part of the integrated circuit die and/or integrated circuit package (not shown) comprising the digital device 100 but externally connected thereto.

Normally, the primary clock oscillator comprising the oscillator inverter 124 and frequency determining element 128 provides a pulse train of clock signals, e.g., plurality of clock pulses, (timing diagram A of FIG. 2) to the processor 102 and the timer counter 106. The timer counter 106 counts a certain number of pulses from the primary clock oscillator and will wake up the processor 102 when that certain number of pulses has been counted. However, if any component of the primary clock oscillator should fail for any reason, e.g., an external component (frequency determining element 128, and/or one or more of the load capacitors 130 and 132) fail, or connection to the die or package fail, then the timer counter 106 will never count up to the certain number of pulses from the primary clock oscillator so as to periodically wake up the processor 102.

According to the teachings of this disclosure, a delay and monitoring circuit is charged to a first logic level when the primary clock oscillator is operational (working properly), and discharges (times out) to a second logic level if the primary clock oscillator fails. The output from this delay circuit when at the second logic level may be used to alert (interrupt) the processor 102 so that a primary clock oscillator failure error routine may be initiated by the processor 102. The digital device 100 may use the internal backup clock oscillator 104 if the clock oscillator fails. The delay and monitoring circuit insures that the processor 102 will wake up if in a sleep mode, and be alerted to use the backup clock 104 when in its operational mode. The backup clock oscillator 104 may also be an internal clock that the processor normally uses for operation thereof, and the primary clock oscillator (with the high stability frequency determining element 128) may be used as a precision timer in combination with the processor internal oscillator (e.g., backup clock oscillator 104).

Referring now to FIG. 2, depicted are schematic voltage-time waveforms of various signal points in the schematic of the digital device shown in FIG. 1. A plurality of clock pulses (waveform A) from the primary clock oscillator are coupled through the blocking capacitor 120 to the diode 118. The diode 118 rectifies (passes only the positive voltage components—waveform B) to the voltage storage capacitor 116, thereby charging the voltage storage capacitor 116 to a positive voltage substantially equal to the voltage value of the plurality of pulses (waveform C). The blocking capacitor 120 is also used to block DC if the output of the buffer 122 should be forced to a steady state logic high ("1"). The current sink 112 continuously draws a constant current from the voltage storage capacitor 116, but this constant current is substantially less then the charging current supplied from the diode 118 when the plurality of pulses from the primary clock oscillator are operational. However, if the primary clock oscillator stops working, i.e., no plurality of pulses to charge the voltage storage capacitor 116, then the current sink 112 will linearly draw down the voltage charge on the voltage storage capacitor 116 (waveform C).

The voltage comparator 108 is used to generate a signal to the processor 102 when the primary clock oscillator is working and when it is not. The output of the voltage comparator 108 may be connected to the processor 102 such as an input for an interrupt or a wake-up wherein when the output of the voltage comparator 108 is at a first logic level, e.g., logic low ("0"), the processor 102 functions in a normal fashion (the primary clock oscillator is running), and when the output of the voltage comparator 108 is at a second logic level, e.g., logic high ("1"), the processor 102 is alerted that the primary clock oscillator has ceased functioning (waveform D). The output logic levels from the voltage comparator 108 are determined by comparing the voltage on the voltage storage capacitor 116 with a reference voltage, Vref, from the voltage reference 110. When the voltage charge on the voltage storage capacitor 116 is greater than Vref the output of the voltage comparator 108 is at the first logic level and when the voltage charge on the voltage storage capacitor 116 is equal to or less than Vref the output of the voltage comparator 108 is at the second logic level. Initially during power-on-reset (POR) or brownout-on-reset (BOR), the output from the comparator 108 may be ignored until the voltage storage capacitor 116 has charged up to a normal operating voltage (external clock operational) by receiving the initial few clock pulses from the primary clock oscillator. The voltage reference 110 may be a resistor network voltage divider coupled between a supply voltage and a supply common, a bandgap voltage reference, etc.

The output of the voltage comparator 108 at the second logic level may be used to generate an interrupt that may then wake up the processor 102 from a low power sleep state (mode), or alternatively interrupt the regular operation of the processor 102 and set a primary clock oscillator failure flag.

The comparator 108 and voltage reference need not be precise since only a gross deviation from normal operation is required to switch the output of the comparator 108 to the second logic level. The current sink 112 determines the timeout time period in combination with the capacitance value of the voltage storage capacitor 116 and voltage charge thereon for an external oscillator failure, and will cause the voltage charge on the voltage storage capacitor 116 to decay linearly. The current sink 112 will be at a lower current than the current available from the plurality of clock pulses of the primary clock oscillator so that the voltage storage capacitor 116 can charge up from these plurality of clock pulses. The discharge time for the voltage on the voltage storage capacitor 116 to be equal to or less than the reference voltage is greater than one clock period of the plurality of clock pulses. The discharge time to reach the reference voltage after a failure of the primary clock oscillator may be for example but is not limited to 100 microseconds.

The external clock signal (plurality of clock pulses) cannot be used directly to charge the voltage storage capacitor 116 because if the input signal to the diode 118 is stuck at a logic high, e.g., about Vdd, the voltage storage capacitor 116 could not be discharged by the current sink 112. Thus the blocking capacitor 120 is used to alternating current (AC) couple the pulses from the primary clock oscillator to the diode 118 which only allows a positive voltage to pass therethrough, effectively blocking any negative voltage. As a result of using the blocking capacitor 120, the voltage storage capacitor 116 can only be charged when the pulses from primary clock oscillator are toggling on and off (plurality of clock pulses from the primary clock oscillator are present).

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A digital device having a primary clock oscillator monitor and alarm, comprising:
   a processor having an operational mode and a low power sleep mode;
   a timer counter having an output coupled to an input of the processor, and an input for accepting a plurality of clock pulses;
   a primary clock oscillator coupled to the input of the timer counter and an external frequency determining element, wherein the primary clock oscillator generates the plurality of clock pulses at a frequency determined by the external frequency determining element;
   a direct current (DC) blocking capacitor coupled to the primary clock oscillator;
   a diode connected to the DC blocking capacitor;
   a voltage storage capacitor connected to the diode, wherein the voltage storage capacitor is charged to a voltage through the diode and from the plurality of clock pulses;
   a current sink connected to the voltage storage capacitor, wherein the current sink discharges the voltage on the voltage storage capacitor when not being charged from the plurality of clock pulses; and
   a voltage comparator having an output connected to an input of the processor, a first input connected to the voltage storage capacitor and a second input connected to a reference voltage, wherein
      when the voltage on the voltage storage capacitor is greater than the reference voltage the output of the voltage comparator is at a first logic level, and
      when the voltage on the voltage storage capacitor is less than or equal to the reference voltage the output of the voltage comparator is at a second logic level.

2. The digital device according to claim 1, wherein when the processor is in the low power sleep mode and the output of the voltage comparator is at the second logic level the processor returns to the operational mode.

3. The digital device according to claim 1, wherein when the processor is in the low power sleep mode and the output of the voltage comparator is at the second logic level the processor returns to the operational mode and uses a backup clock for operation thereof.

4. The digital device according to claim 1, wherein when the processor is in the low power sleep mode and the output of the voltage comparator is at the second logic level the processor returns to the operational mode and executes a primary clock oscillator failure program routine.

5. The digital device according to claim 1, wherein when the processor is in the operational mode and the output of the voltage comparator is at the second logic level the processor uses a backup clock for operation thereof.

6. The digital device according to claim 1, wherein when the processor is in the operational mode and the output of the voltage comparator is at the second logic level the processor executes a primary clock oscillator failure program routine.

7. The digital device according to claim 1, wherein the first logic level is a logic low and the second logic level is a logic high.

8. The digital device according to claim 1, wherein the first logic level is a logic high and the second logic level is a logic low.

9. The digital device according to claim 1, wherein the external frequency determining element is a crystal.

10. The digital device according to claim 1, wherein the external frequency determining element is a ceramic resonator.

11. The digital device according to claim 1, wherein the reference voltage is supplied by a voltage reference.

12. The digital device according to claim 1, wherein the voltage reference is a bandgap voltage reference.

13. The digital device according to claim 1, wherein the reference voltage is supplied from a resistor network voltage divider coupled between a supply voltage and a supply common.

14. The digital device according to claim 1, wherein the current sink is a constant current sink.

15. The digital device according to claim 14, wherein the constant current sink discharges the voltage storage capacitor linearly in time.

16. The digital device according to claim 1, further comprising ignoring the output of the voltage comparator upon startup until the voltage storage capacitor is charged from the plurality of clock pulses.

17. A method of monitoring a primary clock oscillator of a digital device and generating an alarm upon failure thereof, said method comprising:
   charging a voltage storage capacitor to a voltage with a plurality of pulses from a primary clock oscillator;
   monitoring the voltage on the voltage storage capacitor with a voltage comparator, wherein
      when the voltage on the voltage storage capacitor is greater than a reference voltage no alarm is issued from the voltage comparator, and
      when the voltage on the voltage storage capacitor is less than or equal to the reference voltage the alarm is issued from the voltage comparator; and
   switching to a backup clock after the alarm is issued from the voltage comparator.

18. The method according to claim 17, wherein a processor has an operational mode and a low power sleep mode, further comprising the step of waking the processor from the low power sleep mode to the operational mode when the alarm is issued from the voltage comparator.

19. The method according to claim 17, wherein a processor has a clock failure exception program routine that is initiated when the alarm is issued from the voltage comparator.

* * * * *